(12) United States Patent
Li et al.

(10) Patent No.: US 11,776,608 B2
(45) Date of Patent: Oct. 3, 2023

(54) STATIC RANDOM-ACCESS MEMORY (SRAM) COMPUTE IN-MEMORY INTEGRATION

(71) Applicant: QUALCOMM Incorporated, San Diego, CA (US)

(72) Inventors: Xia Li, San Diego, CA (US); Jianguo Yao, Londonderry, NH (US); Bin Yang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 675 days.

(21) Appl. No.: 16/672,722

(22) Filed: Nov. 4, 2019

(65) Prior Publication Data

US 2021/0134343 A1   May 6, 2021

(51) Int. Cl.
| | |
|---|---|
| *G06N 3/063* | (2023.01) |
| *G11C 11/40* | (2006.01) |
| *G06F 9/30* | (2018.01) |
| *G11C 11/54* | (2006.01) |
| *G11C 11/413* | (2006.01) |
| *H03K 19/21* | (2006.01) |

(52) U.S. Cl.
CPC .......... *G11C 11/40* (2013.01); *G06F 9/30029* (2013.01); *G06N 3/063* (2013.01); *G11C 11/413* (2013.01); *G11C 11/54* (2013.01); *H03K 19/215* (2013.01)

(58) Field of Classification Search
CPC .......... G06N 3/06; G11C 16/26; G11C 16/24; G11C 7/1006; G11C 7/12; G11C 7/106; G11C 7/1051; G11C 7/18; G11C 11/4091; G11C 11/4096
See application file for complete search history.

(56) References Cited

U.S. PATENT DOCUMENTS

| | | | |
|---|---|---|---|
| 2018/0096730 A1* | 4/2018 | Vo | G11C 7/065 |
| 2019/0087719 A1* | 3/2019 | Seo | G11C 11/419 |
| 2019/0205095 A1* | 7/2019 | Gupta | G11C 11/412 |
| 2020/0098428 A1* | 3/2020 | Gaillardon | G06N 3/08 |
| 2021/0327474 A1* | 10/2021 | Seok | G11C 7/1006 |

* cited by examiner

*Primary Examiner* — Seokjin Kim
(74) *Attorney, Agent, or Firm* — Patterson + Sheridan, LLP

(57) ABSTRACT

Certain aspects provide methods and apparatus for in-memory convolution computation. An example circuit for such computation generally includes a memory cell having a bit-line and a complementary bit-line and a computation circuit coupled to a computation input node of the circuit and at least one of the bit-line or the complementary bit-line. In certain aspects, the computation circuit comprises a counter, an NMOS transistor coupled to the memory cell, and a PMOS transistor coupled to the memory cell, drains of the NMOS and PMOS transistors being coupled to the counter.

12 Claims, 17 Drawing Sheets

501

| X | BL | BLB | EN | Output |
|---|---|---|---|---|
| 1 (+1) | 1 (+1) | 0 (−1) | 1 | 1 (+1) |
| 1 (+1) | 0 (−1) | 1 (+1) | 1 | 0 (−1) |
| 0 (−1) | 1 (+1) | 0 (−1) | 1 | 0 (−1) |
| 0 (−1) | 0 (−1) | 1 (+1) | 1 | 1 (+1) |
| 1 (+1) | 1 (+1) | 0 (−1) | 0 | Vdd/2 |
| 1 (+1) | 0 (−1) | 1 (+1) | 0 | Vdd/2 |
| 0 (−1) | 1 (+1) | 0 (−1) | 0 | Vdd/2 |
| 0 (−1) | 0 (−1) | 1 (+1) | 0 | Vdd/2 |

*FIG. 5E*

STATIC RANDOM-ACCESS MEMORY (SRAM) COMPUTE IN-MEMORY INTEGRATION

FIELD OF THE DISCLOSURE

The present disclosure generally relates to artificial neural networks and, more particularly, to techniques and apparatus for performing in-memory convolution computations.

DESCRIPTION OF RELATED ART

An artificial neural network, which may be composed of an interconnected group of artificial neurons (e.g., neuron models), is a computational device or represents a method performed by a computational device. These neural networks may be used for various applications and/or devices, such as Internet Protocol (IP) cameras, Internet of Things (IoT) devices, autonomous vehicles, and/or service robots.

Convolutional neural networks (CNNs) are a type of feed-forward artificial neural network. Convolutional neural networks may include collections of artificial neurons that each have a receptive field and that collectively tile an input space. Convolutional neural networks have numerous applications. In particular, CNNs have broadly been used in the area of pattern recognition and classification.

In layered neural network architectures, the output of a first layer of artificial neurons becomes an input to a second layer of artificial neurons, the output of a second layer of artificial neurons becomes an input to a third layer of artificial neurons, and so on. Convolutional neural networks may be trained to recognize a hierarchy of features. Computation in convolutional neural network architectures may be distributed over a population of processing nodes, which may be configured in one or more computational chains. These multi-layered architectures may be trained one layer at a time and may be fine-tuned using back propagation.

SUMMARY

Certain aspects of the present disclosure are directed to methods and apparatus for in-memory convolution computation.

Certain aspects provide a circuit for in-memory computation. The circuit generally includes a memory cell having a bit-line and complementary bit-line, and a computation circuit coupled to a computation input node of the circuit and at least one of the bit-line or the complementary bit-line, wherein the computation circuit comprises a counter, a first NMOS transistor coupled to the memory cell, and a first PMOS transistor coupled to the memory cell, drains of the first NMOS and PMOS transistors being coupled to the counter.

Certain aspects provide a method for in-memory computation. The method generally includes storing a first computation parameter in a memory cell having a bit-line and a complementary bit-line, providing a second computation parameter to a computation input node of a circuit, and computing a logical operation of the first computation parameter and the second computation parameter via a computation circuit coupled to the computation input node and at least one of the bit-line or the complementary bit-line, wherein the computation circuit comprises a counter, a first NMOS transistor coupled to the memory cell, and a first PMOS transistor coupled to the memory cell, drains of the first NMOS and PMOS transistors being coupled to the counter.

Other aspects, advantages, and features of the present disclosure will become apparent after review of the entire application, including the following sections: Brief Description of the Drawings, Detailed Description, and the Claims.

BRIEF DESCRIPTION OF THE DRAWINGS

FIG. 5E illustrates a truth table corresponding to the memory cell and a BNN periphery circuit, in accordance with certain aspects of the present disclosure.

DETAILED DESCRIPTION

Certain aspects of the present disclosure provide methods and apparatus for in-memory convolution computations for artificial neural networks.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Example Artificial Neural Networks

Figure 1:
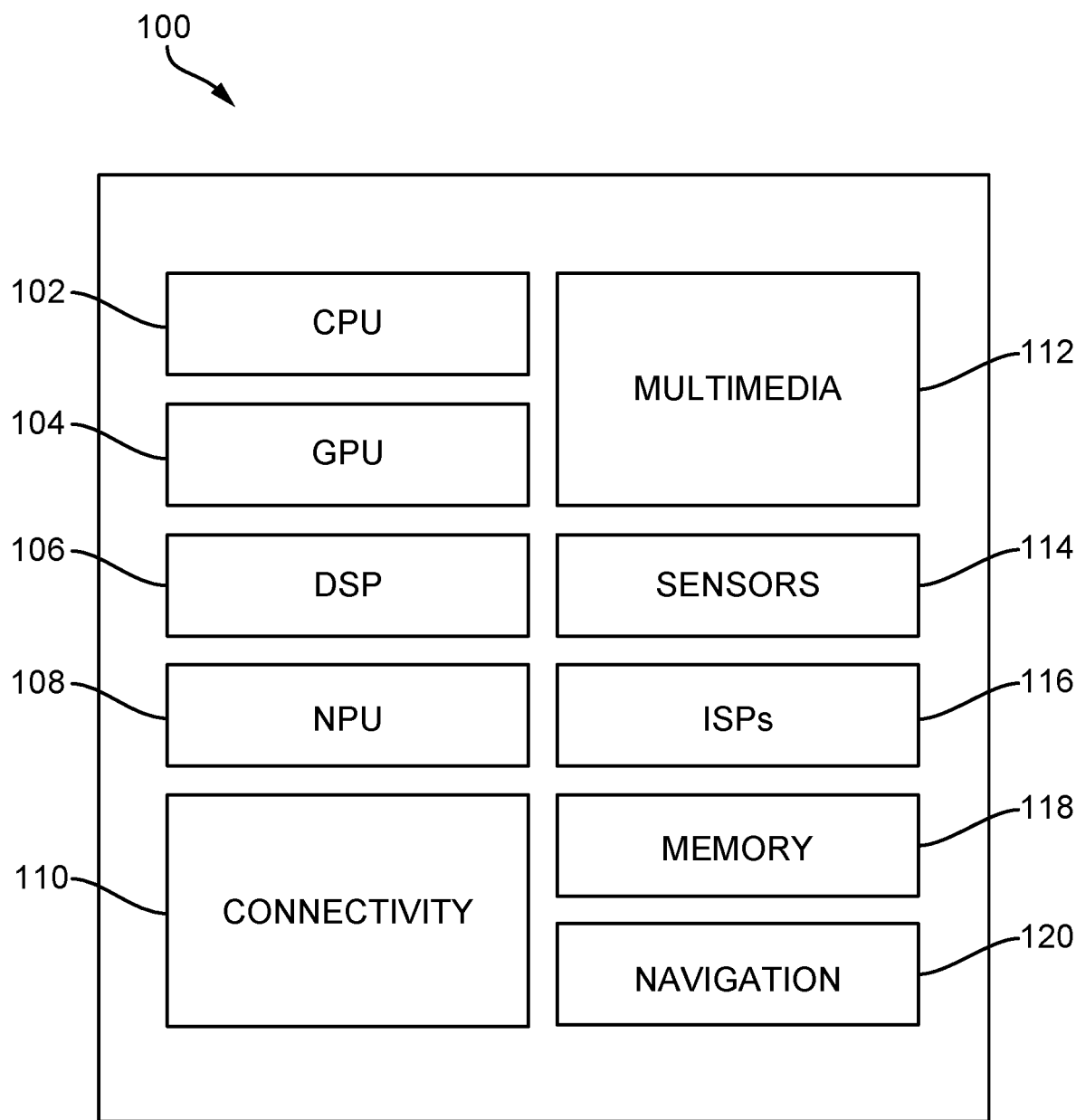
FIG. 1 illustrates an example implementation of a system-on-a-chip (SOC).

FIG. 1 illustrates an example implementation of a system-on-a-chip (SOC) 100, which may include a central processing unit (CPU) 102 or a multi-core CPU configured to perform a parallel Monte Carlo dropout function, in accordance with certain aspects of the present disclosure. Variables (e.g., neural signals and synaptic weights), system parameters associated with a computational device (e.g., neural network with weights), delays, frequency bin information, and task information may be stored in a memory block associated with a neural processing unit (NPU) 108, in a memory block associated with a CPU 102, in a memory block associated with a graphics processing unit (GPU) 104, in a memory block associated with a digital signal processor (DSP) 106, in a memory block 118, or may be distributed across multiple blocks. In certain aspects, weights may be stored in a static random-access memory (SRAM) configured to in-memory computations, as described in more detail herein. Instructions executed at the CPU 102 may be loaded from a program memory associated with the CPU 102 or may be loaded from a memory block 118.

The SOC 100 may also include additional processing blocks tailored to specific functions, such as a GPU 104, a DSP 106, a connectivity block 110, which may include fifth generation (5G) connectivity, fourth generation long term evolution (4G LTE) connectivity, Wi-Fi connectivity, USB connectivity, Bluetooth connectivity, and the like, and a multimedia processor 112 that may, for example, detect and recognize gestures. In one implementation, the NPU is implemented in the CPU, DSP, and/or GPU. The SOC 100 may also include a sensor processor 114, image signal processors (ISPs) 116, and/or navigation module 120, which may include a global positioning system.

The SOC 100 may be based on an ARM instruction set. In an aspect of the present disclosure, the instructions loaded into the CPU 102 may comprise code to search for a stored multiplication result in a lookup table (LUT) corresponding to a multiplication product of an input feature value and a filter weight. The instructions loaded into the CPU 102 may also comprise code to disable a multiplier during a multiplication operation of the multiplication product when a lookup table hit of the multiplication product is detected. In addition, the instructions loaded into the CPU 102 may comprise code to store a computed multiplication product of the input feature and the filter weight when a lookup table miss of the multiplication product is detected.

SOC 100 and/or components thereof may be configured to perform video compression and/or decompression according to aspects of the present disclosure discussed below. By using deep learning architectures to perform video compression and/or decompression, aspects of the present disclosure may accelerate the compression of video content on a device and transmission of the compressed video to another device and/or may accelerate the decompression of compressed video content received at the device.

Deep learning architectures may perform an object recognition task by learning to represent inputs at successively higher levels of abstraction in each layer, thereby building up a useful feature representation of the input data. In this way, deep learning addresses a major bottleneck of traditional machine learning. Prior to the advent of deep learning, a machine learning approach to an object recognition problem may have relied heavily on human engineered features, perhaps in combination with a shallow classifier. A shallow classifier may be a two-class linear classifier, for example, in which a weighted sum of the feature vector components may be compared with a threshold to predict to which class the input belongs. Human engineered features may be templates or kernels tailored to a specific problem domain by engineers with domain expertise. Deep learning architectures, in contrast, may learn to represent features that are similar to what a human engineer might design, but through training. Furthermore, a deep network may learn to represent and recognize new types of features that a human might not have considered.

A deep learning architecture may learn a hierarchy of features. If presented with visual data, for example, the first layer may learn to recognize relatively simple features, such as edges, in the input stream. In another example, if presented with auditory data, the first layer may learn to recognize spectral power in specific frequencies. The second layer, taking the output of the first layer as input, may learn to recognize combinations of features, such as simple shapes for visual data or combinations of sounds for auditory data. For instance, higher layers may learn to represent complex shapes in visual data or words in auditory data. Still higher layers may learn to recognize common visual objects or spoken phrases.

Deep learning architectures may perform especially well when applied to problems that have a natural hierarchical structure. For example, the classification of motorized vehicles may benefit from first learning to recognize wheels, windshields, and other features. These features may be combined at higher layers in different ways to recognize cars, trucks, and airplanes.

Neural networks may be designed with a variety of connectivity patterns. In feed-forward networks, information is passed from lower to higher layers, with each neuron in a given layer communicating to neurons in higher layers. A hierarchical representation may be built up in successive layers of a feed-forward network, as described above. Neural networks may also have recurrent or feedback (also called top-down) connections. In a recurrent connection, the output from a neuron in a given layer may be communicated to another neuron in the same layer. A recurrent architecture may be helpful in recognizing patterns that span more than one of the input data chunks that are delivered to the neural network in a sequence. A connection from a neuron in a given layer to a neuron in a lower layer is called a feedback (or top-down) connection. A network with many feedback connections may be helpful when the recognition of a high-level concept may aid in discriminating the particular low-level features of an input.

Figure 2A:
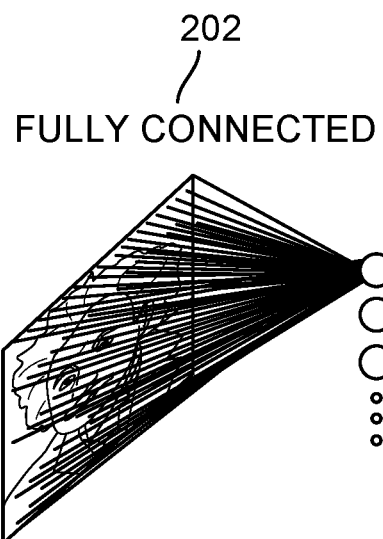
FIG. 2A illustrates an example of a fully connected neural network.
Figure 2B:
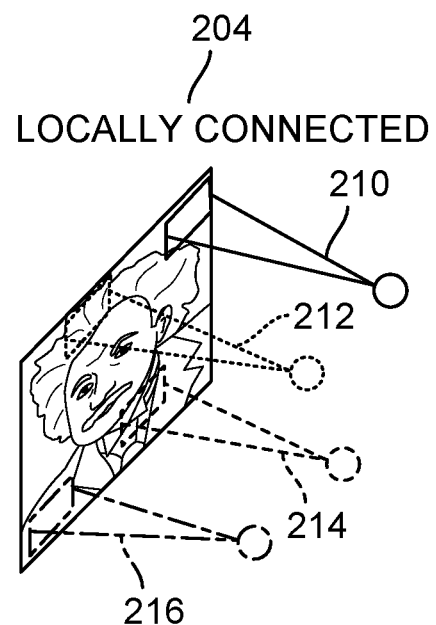
FIG. 2B illustrates an example of a locally connected neural network.

The connections between layers of a neural network may be fully connected or locally connected. FIG. 2A illustrates an example of a fully connected neural network 202. In a fully connected neural network 202, a neuron in a first layer may communicate its output to every neuron in a second layer, so that each neuron in the second layer will receive input from every neuron in the first layer. FIG. 2B illustrates an example of a locally connected neural network 204. In a locally connected neural network 204, a neuron in a first layer may be connected to a limited number of neurons in the second layer. More generally, a locally connected layer of the locally connected neural network 204 may be configured so that each neuron in a layer will have the same or a similar connectivity pattern, but with connections strengths that may have different values (e.g., 210, 212, 214, and 216). The locally connected connectivity pattern may give rise to spatially distinct receptive fields in a higher layer, because the higher layer neurons in a given region may receive inputs that are tuned through training to the properties of a restricted portion of the total input to the network.

Figure 2C:
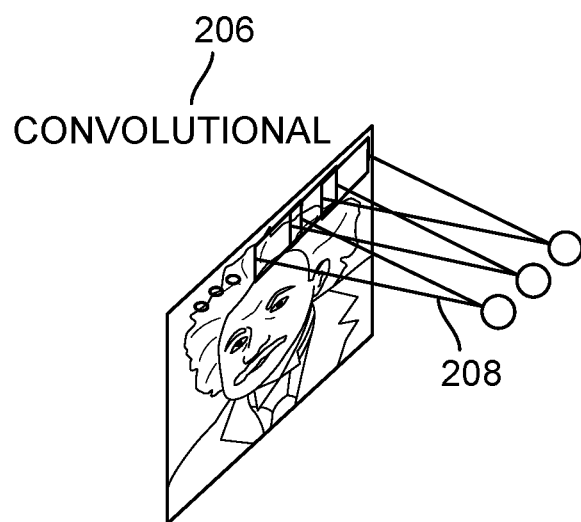
FIG. 2C illustrates an example of a convolutional neural network.

One example of a locally connected neural network is a convolutional neural network. FIG. 2C illustrates an example of a convolutional neural network 206. The convolutional neural network 206 may be configured such that the connection strengths associated with the inputs for each neuron in the second layer are shared (e.g., 208). Convolutional neural networks may be well suited to problems in which the spatial location of inputs is meaningful. Convolutional neural network 206 may be used to perform one or more aspects of video compression and/or decompression, according to aspects of the present disclosure.

Figure 2D:
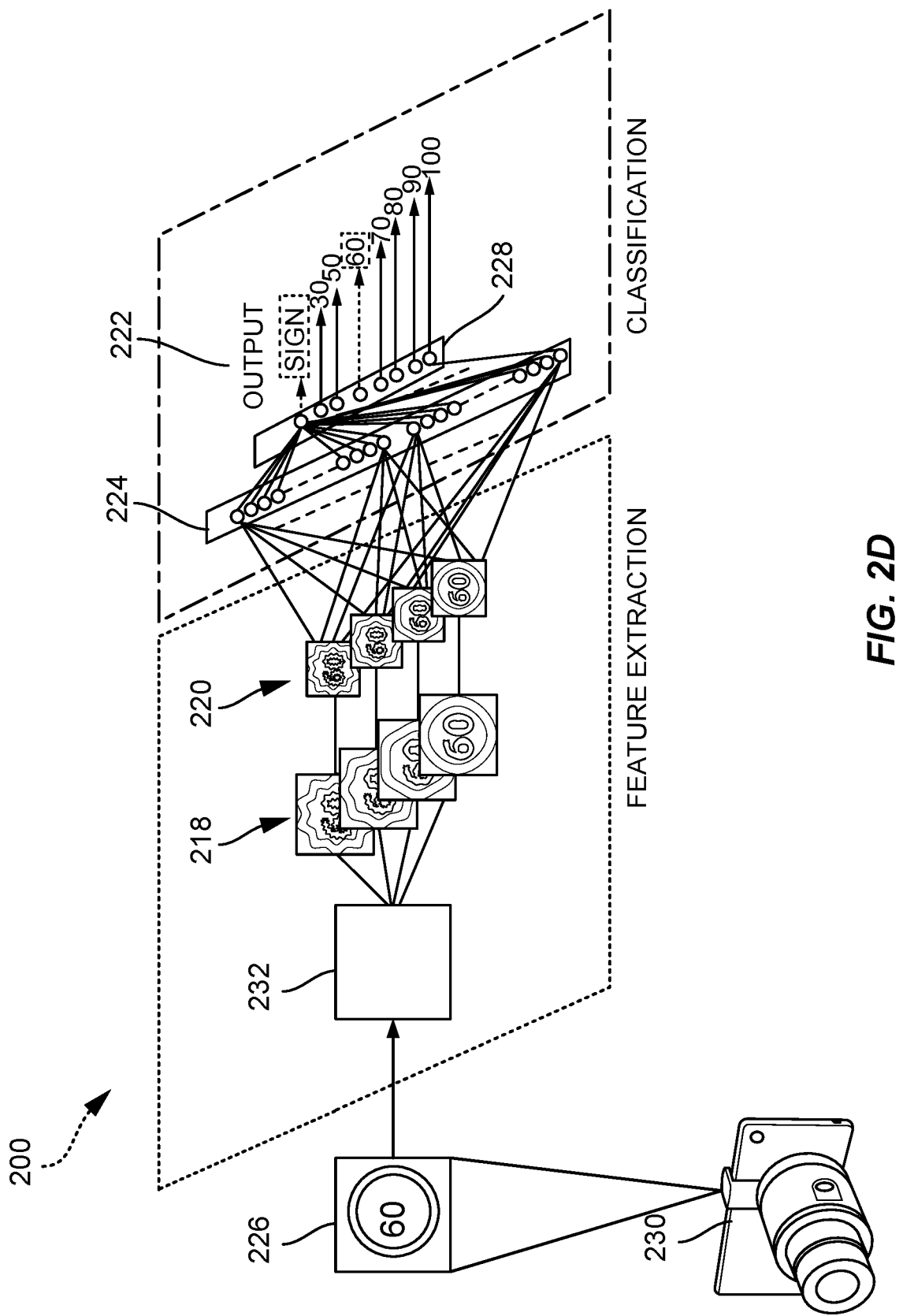
FIG. 2D illustrates a detailed example of a deep convolutional network (DCN) designed to recognize visual features from an image.

One type of convolutional neural network is a deep convolutional network (DCN). FIG. 2D illustrates a detailed example of a DCN 200 designed to recognize visual features from an image 226 input from an image capturing device 230, such as a car-mounted camera. The DCN 200 of the current example may be trained to identify traffic signs and a number provided on the traffic sign. Of course, the DCN 200 may be trained for other tasks, such as identifying lane markings or identifying traffic lights.

The DCN 200 may be trained with supervised learning. During training, the DCN 200 may be presented with an image, such as the image 226 of a speed limit sign, and a forward pass may then be computed to produce an output 222. The DCN 200 may include a feature extraction section and a classification section. Upon receiving the image 226, a convolutional layer 232 may apply convolutional kernels (not shown) to the image 226 to generate a first set of feature maps 218. As an example, the convolutional kernel for the convolutional layer 232 may be a 5×5 kernel that generates 28×28 feature maps. In the present example, because four different feature maps are generated in the first set of feature maps 218, four different convolutional kernels were applied to the image 226 at the convolutional layer 232. The convolutional kernels may also be referred to as filters or convolutional filters.

The first set of feature maps 218 may be subsampled by a max pooling layer (not shown) to generate a second set of feature maps 220. The max pooling layer reduces the size of the first set of feature maps 218. That is, a size of the second set of feature maps 220, such as 14×14, is less than the size of the first set of feature maps 218, such as 28×28. The reduced size provides similar information to a subsequent layer while reducing memory consumption. The second set of feature maps 220 may be further convolved via one or more subsequent convolutional layers (not shown) to generate one or more subsequent sets of feature maps (not shown).

In the example of FIG. 2D, the second set of feature maps 220 is convolved to generate a first feature vector 224. Furthermore, the first feature vector 224 is further convolved to generate a second feature vector 228. Each feature of the second feature vector 228 may include a number that corresponds to a possible feature of the image 226, such as "sign," "60," and "100." A softmax function (not shown) may convert the numbers in the second feature vector 228 to a probability. As such, an output 222 of the DCN 200 is a probability of the image 226 including one or more features.

In the present example, the probabilities in the output 222 for "sign" and "60" are higher than the probabilities of the others of the output 222, such as "30," "40," "50," "70," "80," "90," and "100." Before training, the output 222 produced by the DCN 200 is likely to be incorrect. Thus, an error may be calculated between the output 222 and a target output. The target output is the ground truth of the image 226 (e.g., "sign" and "60"). The weights of the DCN 200 may then be adjusted so the output 222 of the DCN 200 is more closely aligned with the target output. In certain aspects, the weights of the DCN 200 may be stored in an SRAM configured for in-memory computations, as described in more detail herein.

To adjust the weights, a learning algorithm may compute a gradient vector for the weights. The gradient may indicate an amount that an error would increase or decrease if the weight were adjusted. At the top layer, the gradient may correspond directly to the value of a weight connecting an activated neuron in the penultimate layer and a neuron in the output layer. In lower layers, the gradient may depend on the value of the weights and on the computed error gradients of the higher layers. The weights may then be adjusted to reduce the error. This manner of adjusting the weights may be referred to as "back propagation" as it involves a "backward pass" through the neural network.

In practice, the error gradient of weights may be calculated over a small number of examples, so that the calculated gradient approximates the true error gradient. This approximation method may be referred to as stochastic gradient descent. Stochastic gradient descent may be repeated until the achievable error rate of the entire system has stopped decreasing or until the error rate has reached a target level. After learning, the DCN may be presented with new images (e.g., the speed limit sign of the image 226) and a forward pass through the network may yield an output 222 that may be considered an inference or a prediction of the DCN.

Deep belief networks (DBNs) are probabilistic models comprising multiple layers of hidden nodes. DBNs may be used to extract a hierarchical representation of training data sets. A DBN may be obtained by stacking up layers of Restricted Boltzmann Machines (RBMs). An RBM is a type of artificial neural network that can learn a probability distribution over a set of inputs. Because RBMs can learn a probability distribution in the absence of information about the class to which each input should be categorized, RBMs are often used in unsupervised learning. Using a hybrid unsupervised and supervised paradigm, the bottom RBMs of a DBN may be trained in an unsupervised manner and may serve as feature extractors, and the top RBM may be trained in a supervised manner (on a joint distribution of inputs from the previous layer and target classes) and may serve as a classifier.

Deep convolutional networks (DCNs) are networks of convolutional networks, configured with additional pooling and normalization layers. DCNs have achieved state-of-the-art performance on many tasks. DCNs can be trained using supervised learning in which both the input and output targets are known for many exemplars and are used to modify the weights of the network by use of gradient descent methods.

DCNs may be feed-forward networks. In addition, as described above, the connections from a neuron in a first layer of a DCN to a group of neurons in the next higher layer are shared across the neurons in the first layer. The feed-forward and shared connections of DCNs may be exploited for fast processing. The computational burden of a DCN may be much less, for example, than that of a similarly sized neural network that comprises recurrent or feedback connections.

The processing of each layer of a convolutional network may be considered a spatially invariant template or basis projection. If the input is first decomposed into multiple channels, such as the red, green, and blue channels of a color image, then the convolutional network trained on that input may be considered three-dimensional, with two spatial dimensions along the axes of the image and a third dimension capturing color information. The outputs of the convolutional connections may be considered to form a feature map in the subsequent layer, with each element of the feature map (e.g., 220) receiving input from a range of neurons in the previous layer (e.g., feature maps 218) and from each of the multiple channels. The values in the feature map may be further processed with a non-linearity, such as a rectification, max(0,x). Values from adjacent neurons may be further pooled, which corresponds to down sampling, and may provide additional local invariance and dimensionality reduction. Normalization, which corresponds to whitening, may also be applied through lateral inhibition between neurons in the feature map.

The performance of deep learning architectures may increase as more labeled data points become available or as computational power increases. Modern deep neural networks are routinely trained with computing resources that are thousands of times greater than what was available to a typical researcher just fifteen years ago. New architectures and training paradigms may further boost the performance of deep learning. Rectified linear units may reduce a training issue known as vanishing gradients. New training techniques may reduce over-fitting and thus enable larger models to achieve better generalization. Encapsulation techniques may abstract data in a given receptive field and further boost overall performance.

Figure 3:
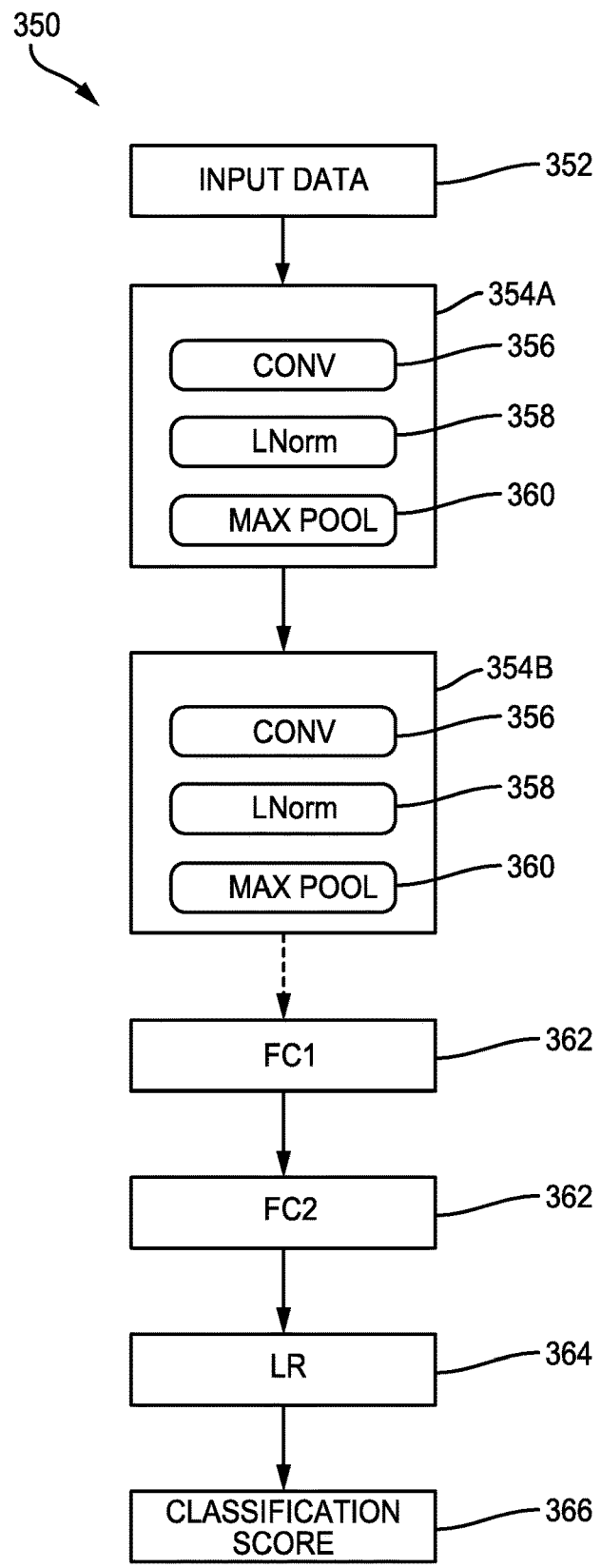
FIG. 3 is a block diagram illustrating a DCN.

FIG. 3 is a block diagram illustrating a deep convolutional network 350. The deep convolutional network 350 may include multiple different types of layers based on connectivity and weight sharing. As shown in FIG. 3, the deep convolutional network 350 includes the convolution blocks 354A, 354B. Each of the convolution blocks 354A, 354B may be configured with a convolution layer (CONV) 356, a normalization layer (LNorm) 358, and a max pooling layer (MAX POOL) 360. Deep convolutional network 350 may be used to perform video compression and/or decompression, according to aspects of the present disclosure.

The convolution layers 356 may include one or more convolutional filters, which may be applied to the input data to generate a feature map. Although only two of the convolution blocks 354A, 354B are shown, the present disclosure is not so limiting, and instead, any number of the convolution blocks 354A, 354B may be included in the deep convolutional network 350 according to design preference. The normalization layer 358 may normalize the output of the convolution filters. For example, the normalization layer 358 may provide whitening or lateral inhibition. The max pooling layer 360 may provide down sampling aggregation over space for local invariance and dimensionality reduction.

The parallel filter banks, for example, of a deep convolutional network may be loaded on a CPU 102 or GPU 104 of an SOC 100 to achieve high performance and low power consumption. In alternative aspects, the parallel filter banks may be loaded on the DSP 106 or an ISP 116 of an SOC 100. In addition, the deep convolutional network 350 may access other processing blocks that may be present on the SOC 100, such as sensor processor 114 and navigation module 120, dedicated, respectively, to sensors and navigation.

The deep convolutional network 350 may also include one or more fully connected layers 362 (FC1 and FC2). The deep convolutional network 350 may further include a logistic regression (LR) layer 364. Between each layer 356, 358, 360, 362, 364 of the deep convolutional network 350 are weights (not shown) that are to be updated. In certain aspects, the weights may be stored in an SRAM configured for in-memory computations, as described in more detail herein. The output of each of the layers (e.g., 356, 358, 360, 362, 364) may serve as an input of a succeeding one of the layers (e.g., 356, 358, 360, 362, 364) in the deep convolutional network 350 to learn hierarchical feature representations from input data 352 (e.g., images, audio, video, sensor data and/or other input data) supplied at the first of the convolution blocks 354A. The output of the deep convolutional network 350 is a classification score 366 for the input data 352. The classification score 366 may be a set of probabilities, where each probability is the probability of the input data including a feature from a set of features.

Example Static Random-Access Memory (SRAM) for In-Memory Computing

In binary weight networks, weights and neuron activations are binarized and may be represented by +1 or −1 values. A convolutional neural network (CNN) with binary weights may be implemented with a smaller footprint than an equivalent network implemented with real-valued weights. Binary-weight approximations of large CNNs may be implemented with a smaller amount of memory storage, and thus, may be implemented in small portable devices while maintaining relatively close to the same level of accuracy as real-valued networks. Binary network computations may be performed by enabling binary convolutions within a static random-access memory (SRAM) array. Binary convolutions may include bit-wise exclusive OR (XOR) operations (or other logic operations), as described in more detail herein.

Figure 4:
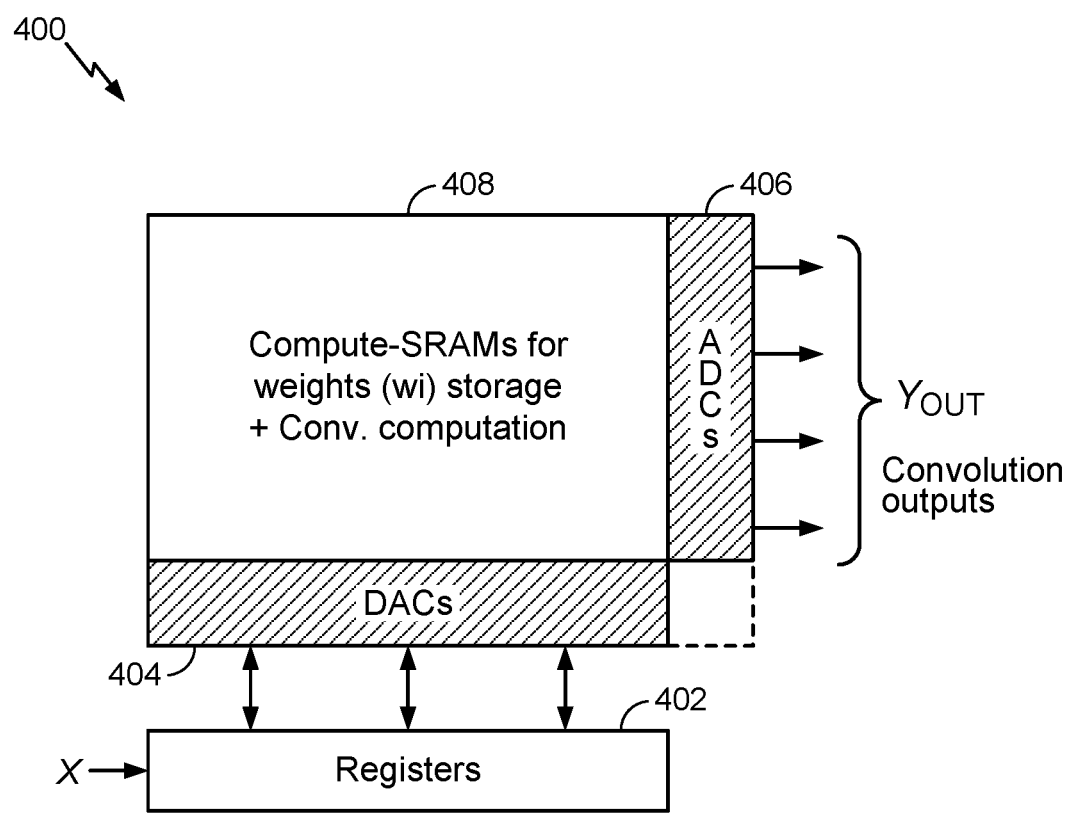
FIG. 4 illustrates a computation system having a static random-access memory (SRAM) implemented for in-memory convolution computation, in accordance with certain aspects of the present disclosure.

FIG. 4 illustrates an example computation system 400 having an SRAM 408 implemented for in-memory convolution computation, in accordance with certain aspects of the present disclosure. The SRAM 408 may include an array of word lines (WLs), each having a complementary word line (WLB). Moreover, the SRAM may include an array of bit lines (BLs), each having a complementary bit line (BLB). Each of the intersections of the BLs and WLs is associated with a memory cell of the SRAM. Thus, the SRAM 408 includes a matrix of i×j memory cells, i representing the number of WLs and j representing the number of BLs.

As illustrated, input data, labeled "X" in FIG. 4, may be input to registers 402. The input data may be provided to word lines of the SRAM 408 via digital-to-analog converters (DACs) 404. The SRAM 408 may perform in-memory convolution computation based on the input data and as a function of weights ($w_i$) stored in the memory cells of the SRAM 408. The output of the computation may be input to analog-to-digital converters (ADCs) 406, which provide digital convolution outputs, labeled in FIG. 4 as "$Y_{OUT}$."

FIGS. 5A, 5B, 5C, and 5D illustrate a memory cell 500 of the SRAM 408 and various implementations of a binary neural network (BNN) periphery circuit 530 (also referred to as a "computation circuit"), in accordance with certain aspects of the present disclosure. FIGS. 5A, 5B, 5C, and 5D describe operations for digital computation in memory or in periphery circuitry. FIG. 5E illustrates a truth table 501 corresponding to the memory cell 500 and the BNN periphery circuit 530, in accordance with certain aspects of the present disclosure. The truth table 501 illustrates logic operations using both binary ("0" and "1") and ternary ("+1" and "−1") logic. While the truth table 501 corresponds to an XNOR operation, any of various logical operations may be performed using the techniques described herein. XNOR operation is the logical complement of XOR operation, which may be used for binary multiply computation for convolution.

Figure 5A:
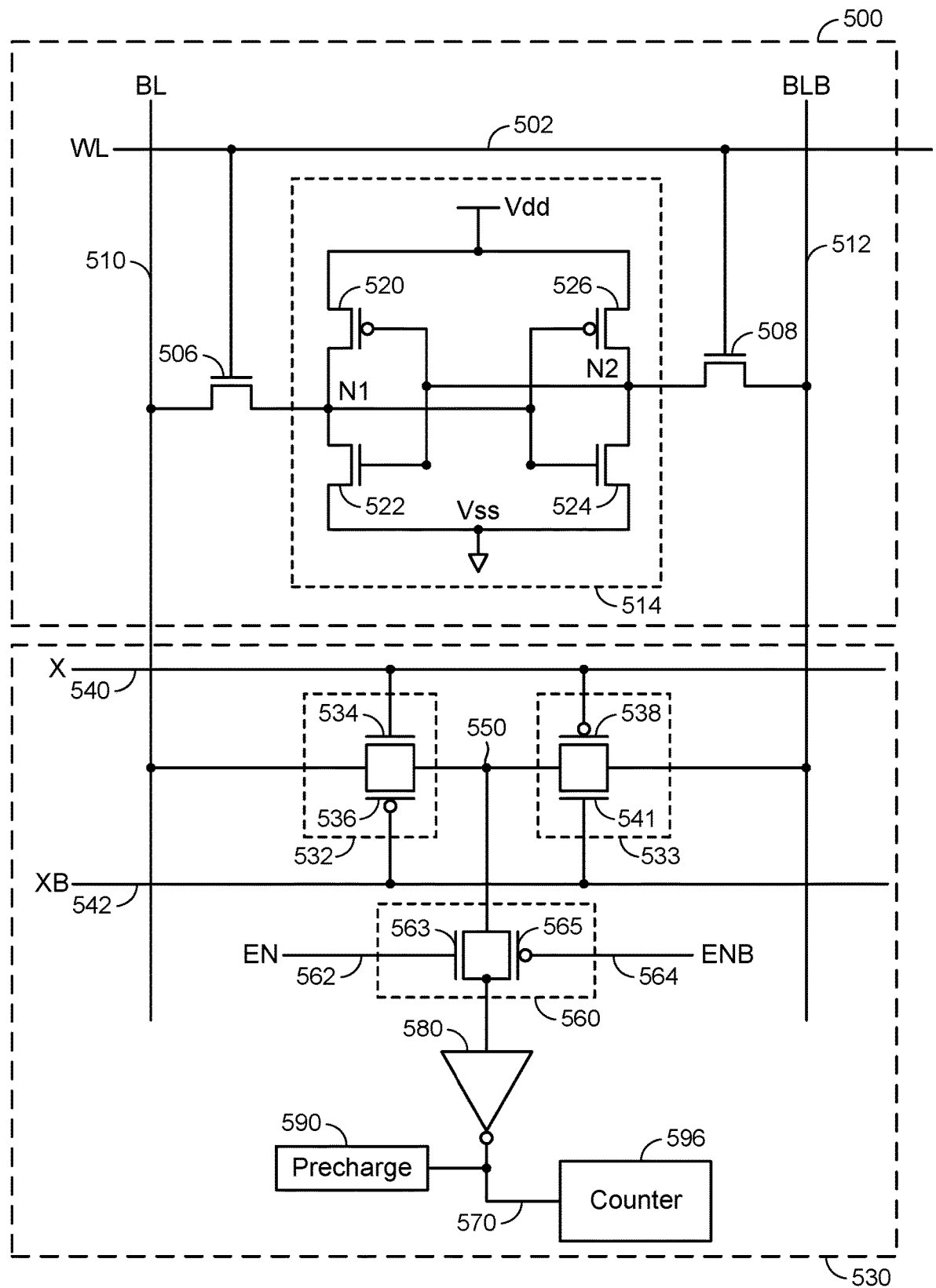
FIGS. 5A, 5B, 5C, and 5D illustrate a memory cell of the SRAM and various implementations of a binary neural network (BNN) periphery circuit, in accordance with certain aspects of the present disclosure.

As illustrated in FIG. 5A, the SRAM 408 is implemented using a word line (WL) 502. The WL 502 is coupled to control inputs of pass gate transistors 506, 508 for selectively coupling respective bit lines (BL 510, BLB 512) to respective nodes N1, N2 (also referred to as an output node (e.g., SRAM internal output node), and a complementary output node (e.g., SRAM internal complementary output node), respectively) of a flip-flop (FF) 514. The pass gate transistor 506 and/or the pass gate transistor 508 may each be implemented using a metal-oxide-semiconductor (MOS) transistor.

As illustrated, the FF 514 is part of the SRAM 408 and coupled between a voltage rail (Vdd) and a reference potential node (e.g., electric ground or Vss). The FF 514 includes a p-type metal-oxide-semiconductor (PMOS) transistor 520 having a drain coupled to a drain of an n-type metal-oxide-semiconductor (NMOS) transistor 522, forming part of node N1. The FF 514 also includes a PMOS transistor 526 having a drain coupled to a drain of an NMOS transistor 524, forming part of node N2. The gates of the PMOS transistor 520 and the NMOS transistor 522 are coupled to the node N2, and the gates of the PMOS transistor 526 and the NMOS transistor 524 are coupled to the node N1, as illustrated. As described in more detail herein, a weight parameter for the neural network may be stored in the FF 514 at nodes N1, N2 of each of the memory cells of the SRAM. The nodes N1, N2 represent the output and complementary output nodes of the FF 514, respectively. In certain aspects, a weight parameter may be previously stored in the FF 514 of the memory cell 500 at nodes N1, N2.

In certain aspects, a BNN periphery circuit 530 may be coupled to the memory cell 500. The BNN periphery circuit 530 includes transmission gates 532, 533, each including an NMOS transistor 534, 541, and a PMOS transistor 536, 538, as illustrated. As illustrated, the source of the transistor 534 is connected to a drain of the transistor 536, and vice versa. Moreover, the source of the transistor 538 is connected to the drain of the transistor 541, and vice versa.

The NMOS transistor 534 and the PMOS transistor 538 may have gates controlled by the input X 540 (also referred to as a "computation input node"), and the PMOS transistor 536 and the NMOS transistor 541 may have gates controlled by the complementary input XB 542 (also referred to as a "complementary computation input node"). In certain aspects, a transmission gate 560 (e.g., an enable circuit) may be coupled to the node 550 between the transmission gates 532, 533, allowing the BNN periphery circuit 530 to be selectively enabled or disabled via an enable (EN) signal at an EN node 562 and a complementary enable (ENB) signal at an ENB node 564 (also referred to as a "complementary enable input node"), as illustrated in FIG. 5A. As illustrated, the transmission gate 560 includes an NMOS transistor 563 and a PMOS transistor 565, a source of the NMOS transistor 563 being coupled to a drain of the PMOS transistor, and vice versa, to form a transmission gate.

During a computation process, the weight stored in the FF 514 may be read by turning on pass gate transistors 506, 508 via the WL 502 such that the voltages at the BL 510 and the BLB 512 are set to respective voltages at the output and complementary output nodes N1, N2. When the input X 540 is logic high, the transmission gate 532 is turned on, and the transmission gate 533 is turned off. Therefore, the logic state at node 550 may be set to the logic state of the BL 510. When the input X 540 is logic low, the transmission gate 532 is turned off, and the transmission gate 533 is turned on. Therefore, the logic state at node 550 may be set to the logic state of the BLB 512.

The truth table 501, illustrated in FIG. 5E, represents an XNOR operation of the input X and the BLB (or an XOR operation of the input X and the BL). For instance, when the input X is logic high, and the BL is logic low, the logic state at node 550 may be equal to the logic state of the BL 510.

As illustrated, an inverter 580 may be coupled between the transmission gate 560 and the output node 570 (e.g., read bit-line (RBL)). When the transmission gate 560 is turned on, the logic state at the output node 570 is equal to the inverse of the logic state at node 550. Thus, the logic state at the output node 570 may be logic high, representing an XNOR operation of the input X (logic high) and the BLB (e.g., logic low), or an XOR operation of the input X (logic high) and the BL (e.g., logic high).

In certain aspects, a precharge circuit 590 may be coupled to the output node 570, as illustrated. BL and BLB may each be connected to a pre-charge circuit (not illustrated). The precharge circuit 590 may precharge the output node 570 (e.g., RBL) to Vdd/2 when the BNN periphery circuit 530 is disabled (e.g., the transmission gate 560 is turned off), allowing for a faster computation upon enabling of the BNN periphery circuit 530. In some cases, the BL 510 and BLB 512 may also be precharged prior to the computation operations described herein. In certain aspects, a counter 596 may be coupled to the output node 570 to accumulate computations across multiple memory cells. In other words, a computation may be performed for each memory cell associated with the BL 510 and the BLB 512, which may be accumulated by the counter 596.

Figure 5B:
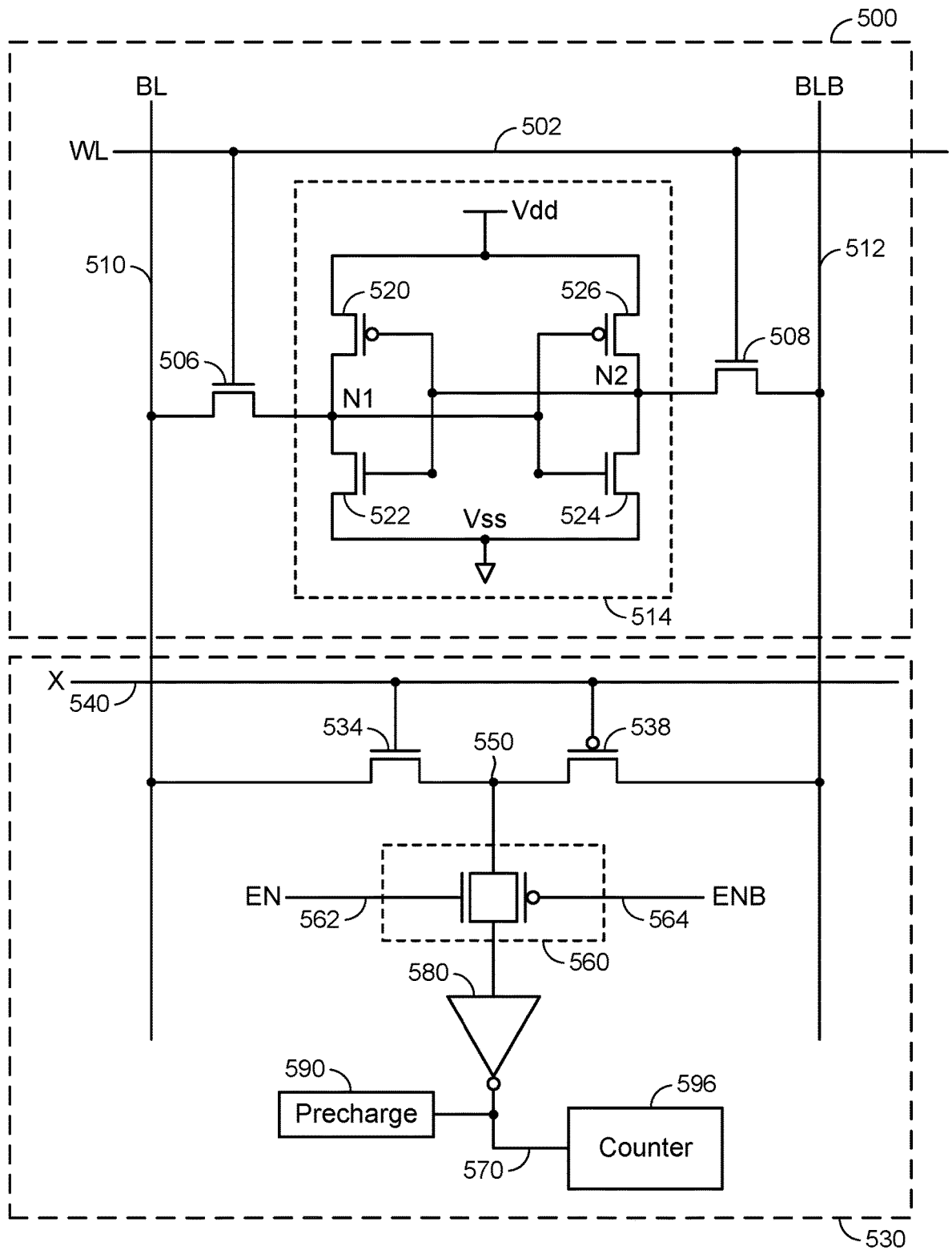
Figure 5C:
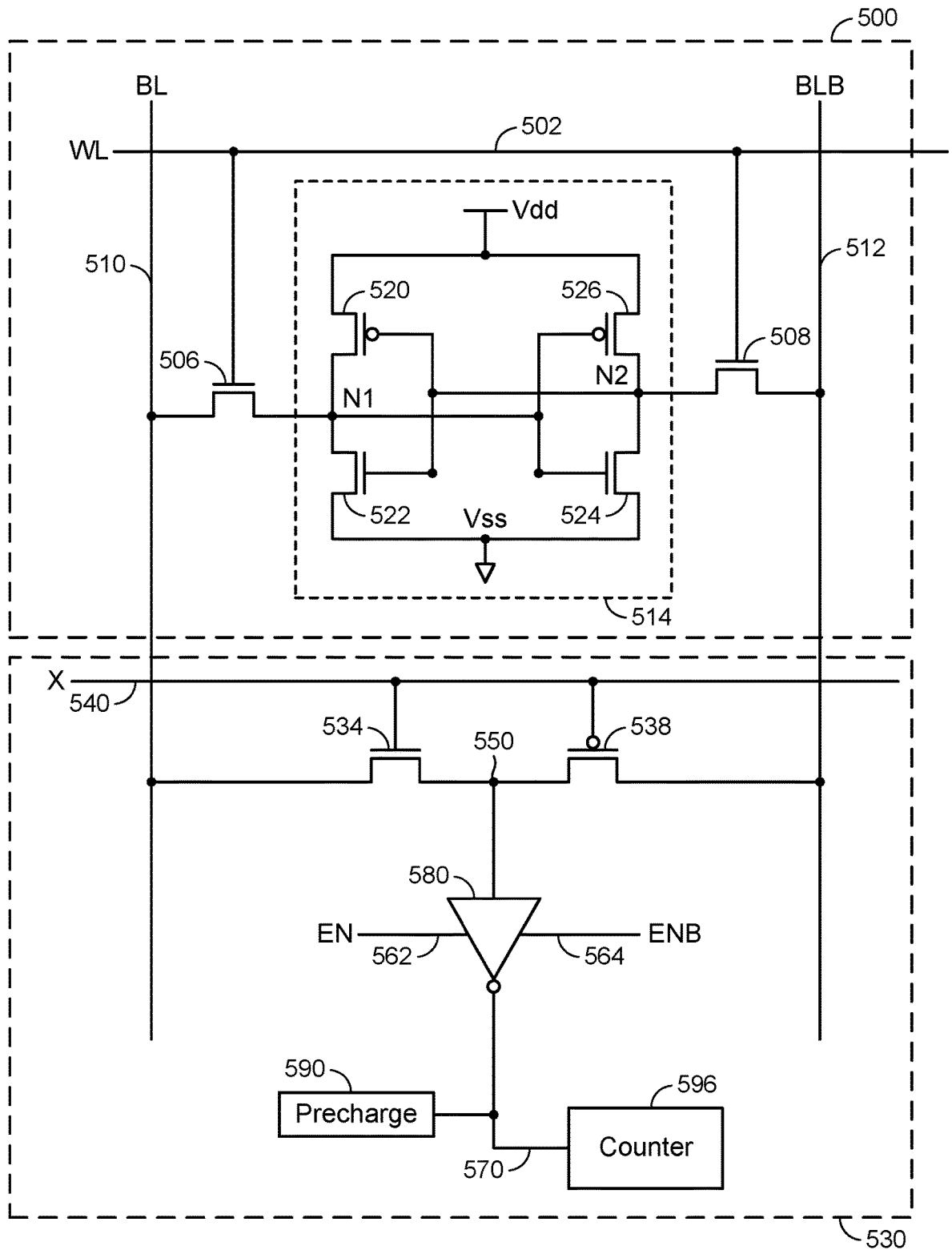

As illustrated in FIG. 5B, instead of transmission gates 532, 533, each of the switches between the node 550 and a respective one of the BL 510 and BLB 512 may be implemented with only a single transistor (e.g., NMOS transistor 534 or PMOS transistor 538). As illustrated in FIG. 5C, enabling of the BNN periphery circuitry may be integrated as part of the inverter 580, with inputs for the EN and ENB signals.

Figure 5D:
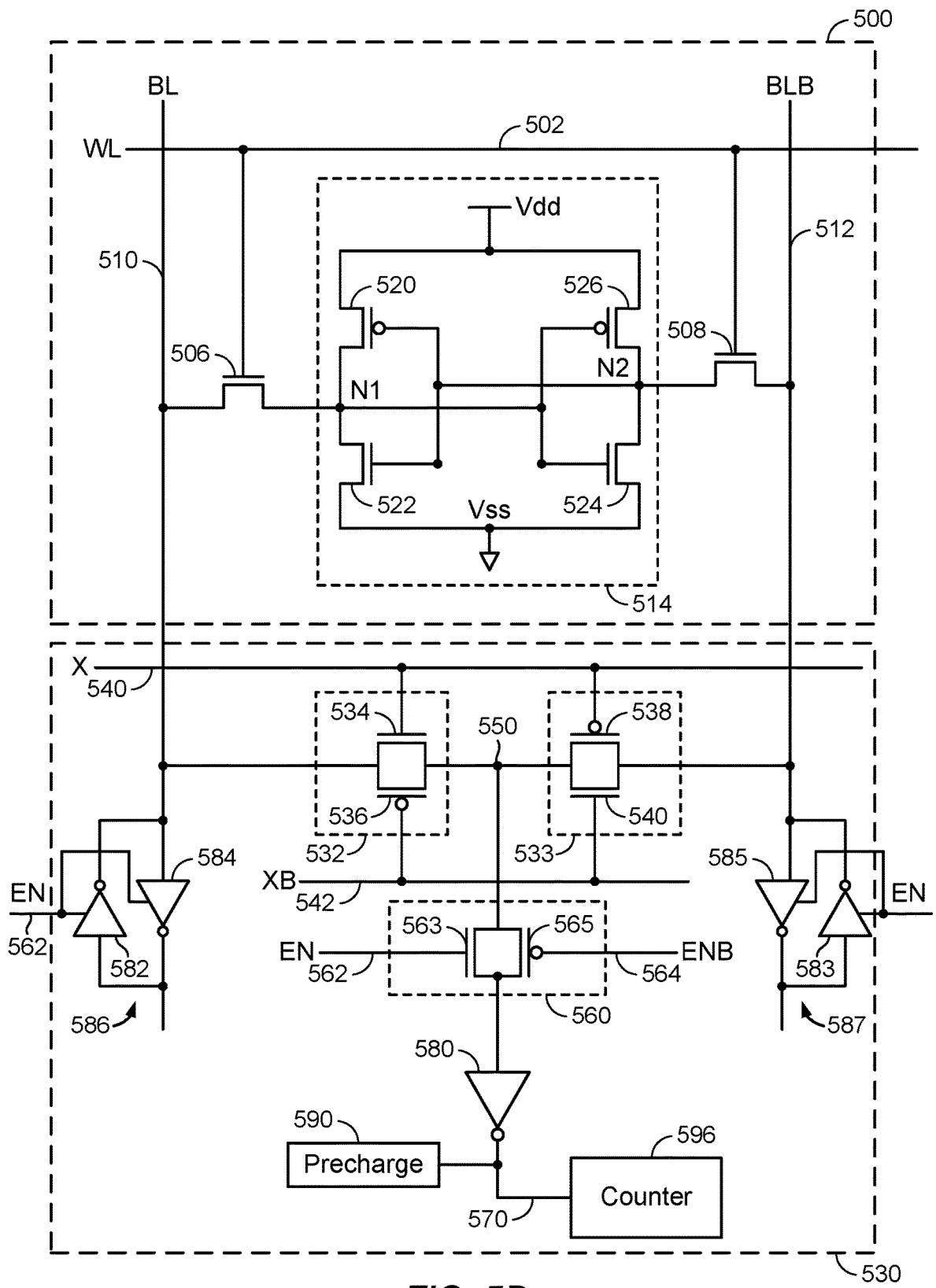

In certain aspects, a transition assist circuit may be used to increase the pull-up and pull-down speed of the BL 510 and/or BLB 512. For instance, as illustrated in FIG. 5D, a transition assist circuit 586, 587 may be coupled to each of the BL 510 and the BLB 512, respectively, as illustrated. The transition assist circuits 586, 587 may each include an inverter 582, 583 having an output coupled to an input of another inverter 584, 585, and vice versa. The transition assist circuits 586, 587 may be coupled between a reference potential node or bit-line controller (not shown) and the memory cell 500. The transition assist circuits 586, 587 increase the pull-up and pull-down speed of the BL and BLB. In certain aspects, the transition assist circuits 586, 587 may be enabled via the signal at the EN node 562, as illustrated.

Figure 6A:
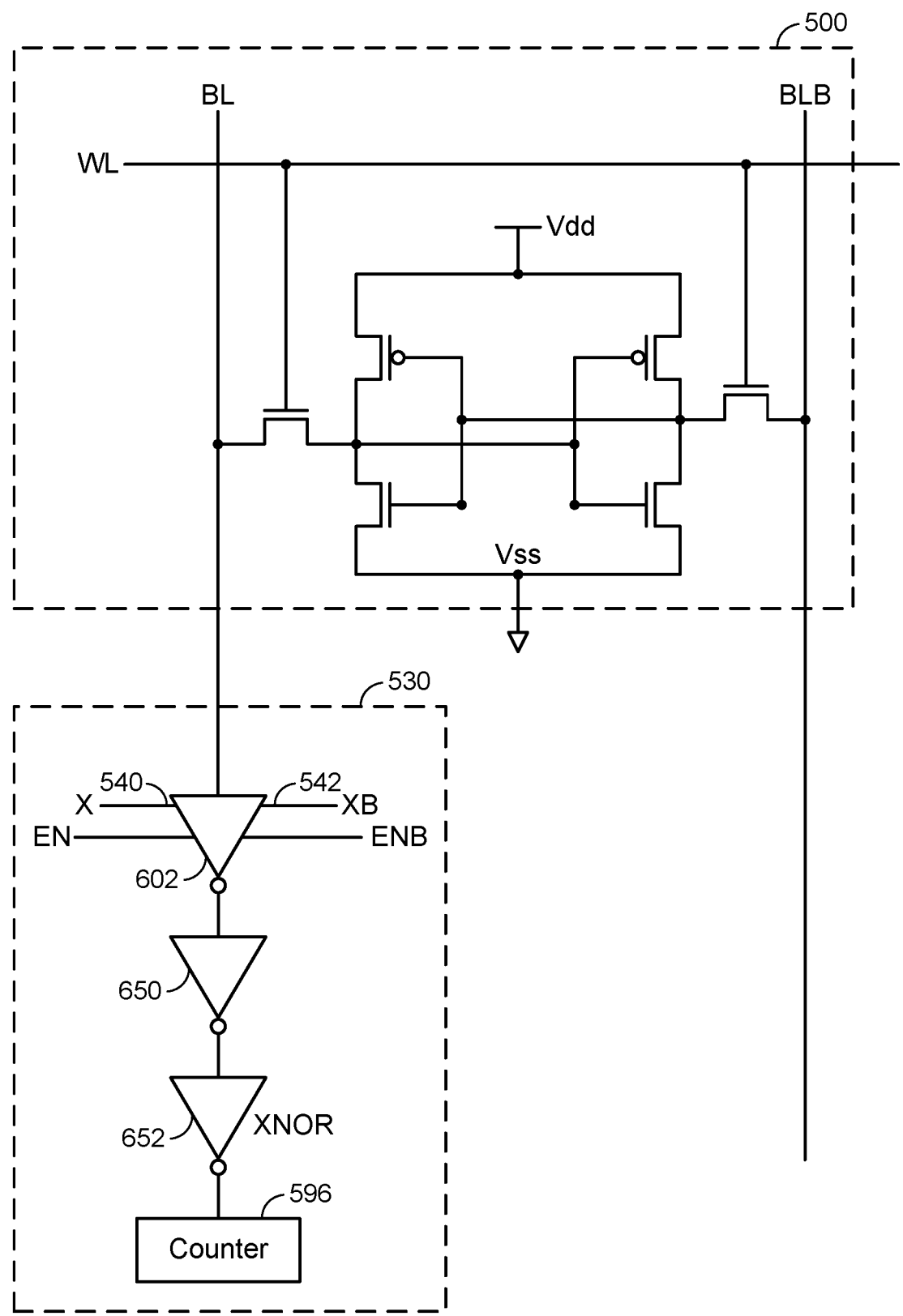
FIGS. 6A, 6B, 6C, 6D, and 6E illustrate the memory cell and a BNN periphery circuit implemented at a bit-line or a complementary bit-line of the memory cell, in accordance with certain aspects of the present disclosure.
Figure 6B:
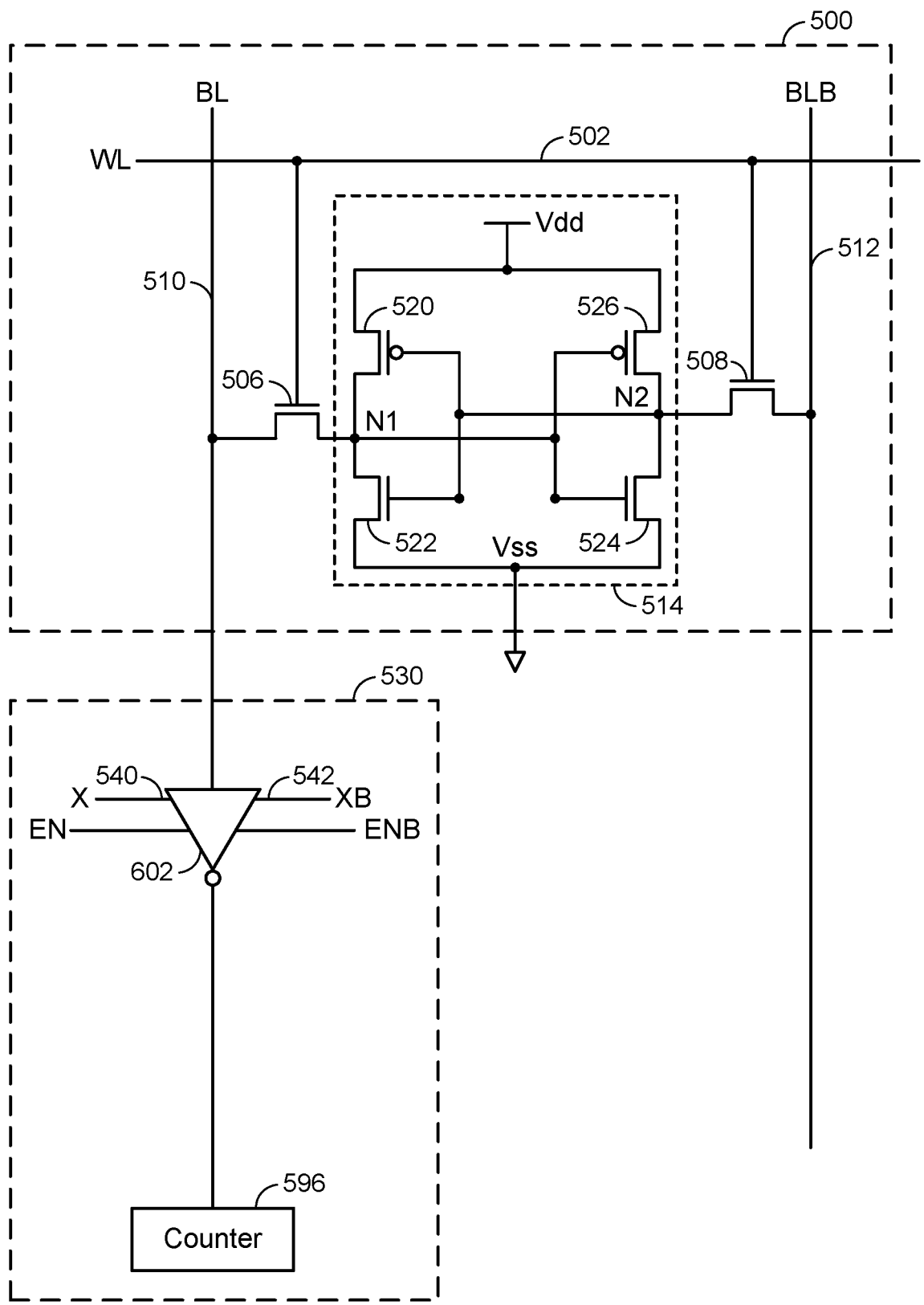
Figure 6C:
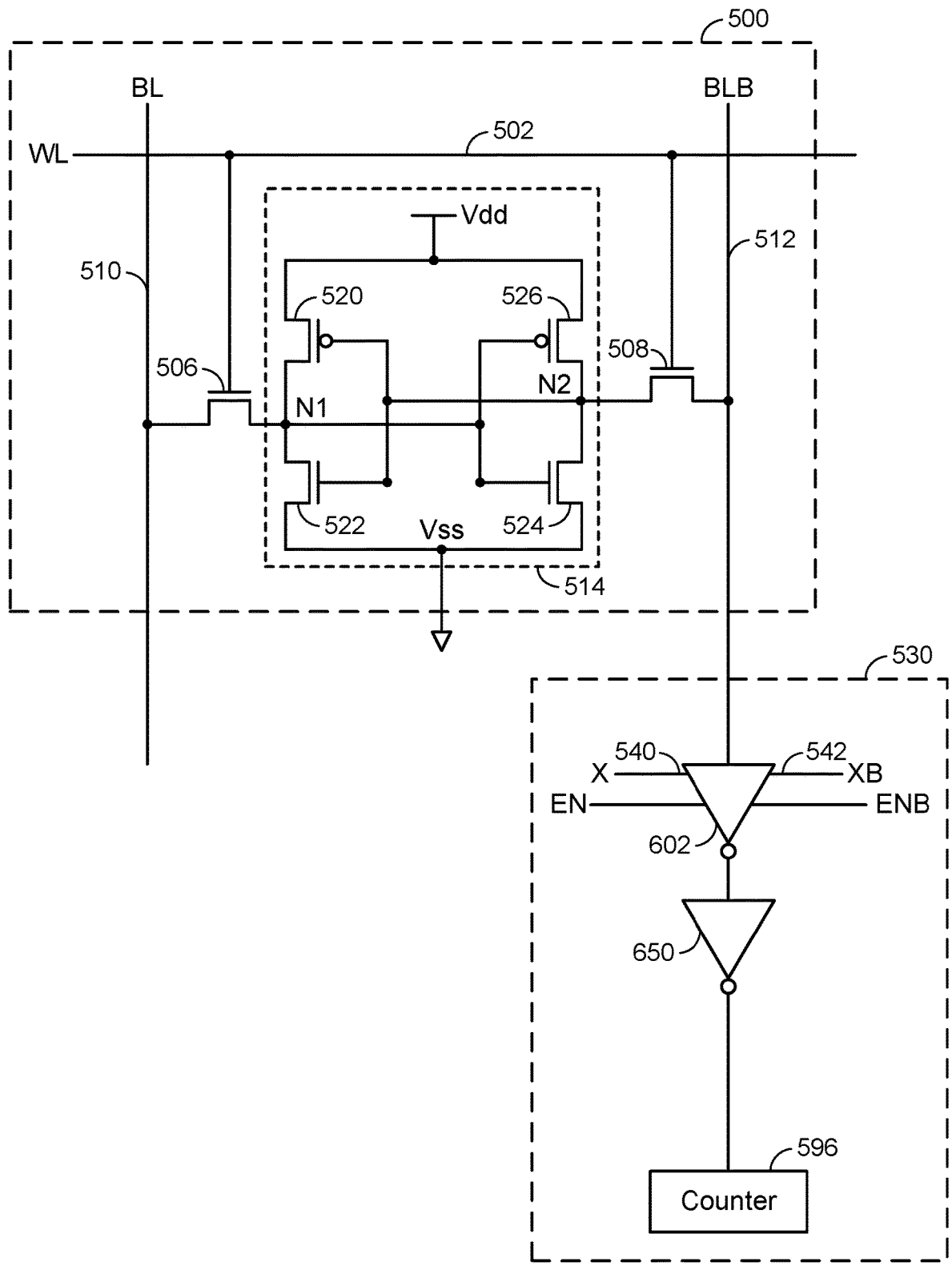
Figure 6D:
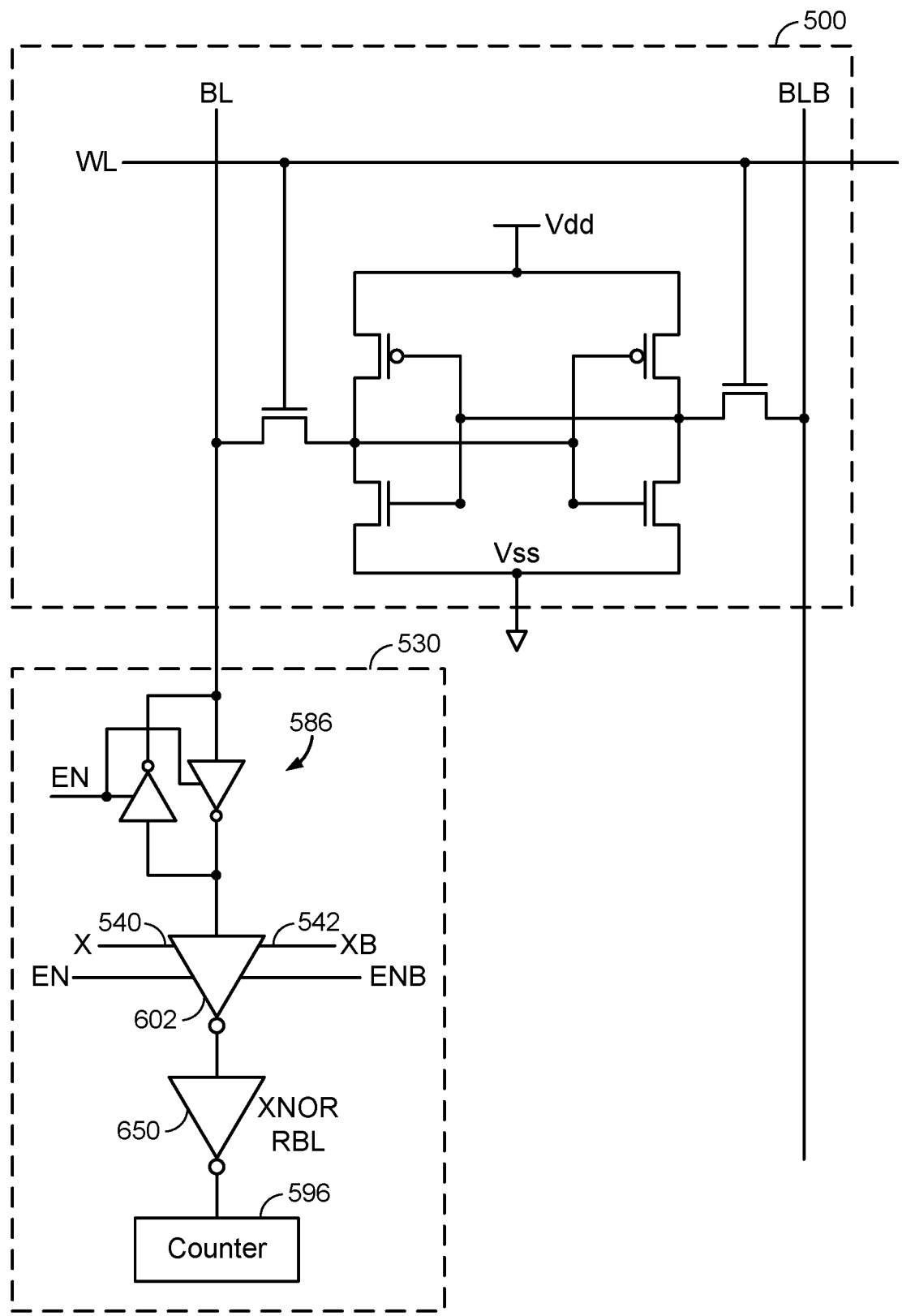
Figure 6E:
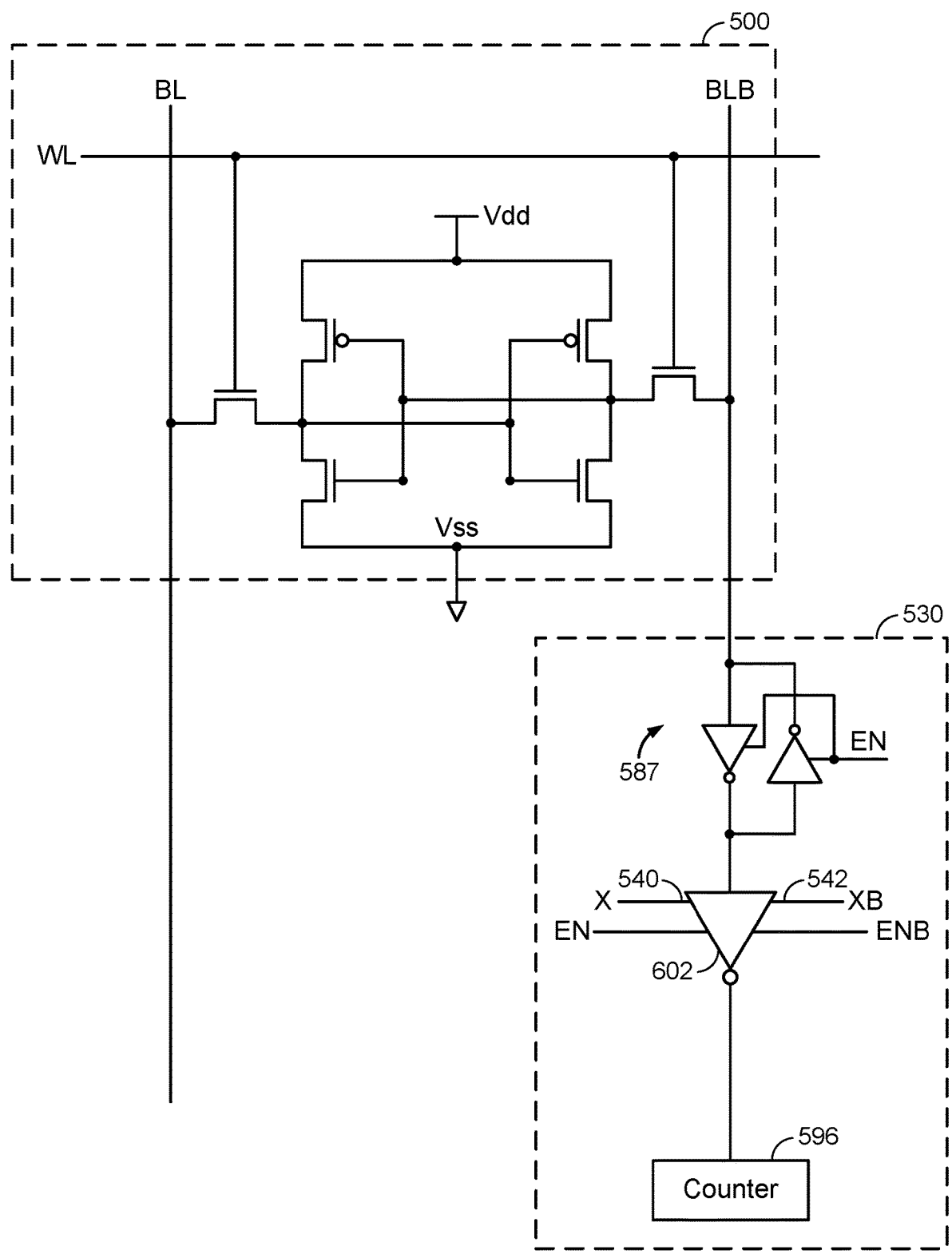

FIGS. 6A, 6B, 6C, 6D, and 6E illustrate the memory cell 500 and a BNN periphery circuit 530 implemented at a BL or a BLB of the memory cell 500, in accordance with certain aspects of the present disclosure. The BNN periphery circuit 530 may include an inverter 602 that generates an inverter output signal based on the signal at the input X 540 and complementary input XB 542. Moreover, circuitry for enabling of the BNN periphery circuit 530 may be integrated in the inverter 602, as described in more detail herein. As illustrated in FIG. 6A, the BNN periphery circuit 530 may be implemented with inverters 650, 652 (e.g., for waveform correction), or as illustrated in FIG. 6B, implemented without the inverters 650, 652. As illustrated in FIG. 6C, the BNN periphery circuit 530 may be coupled to the BLB 512, as opposed to the BL 510. In this case, only a single inverter 650 (as opposed to two inverters 650, 652) may be coupled between the inverter 602 and the counter 596 since the logic state at the BLB 512 is complementary to the logic state at the BL 510. When the BNN periphery circuit 530 is implemented on the BL, the BL may be precharged prior to the computation operations described herein. On the other hand when the BNN periphery circuit is implemented on the BLB, the BLB may be precharged prior to the computation operations described herein. In certain aspects, a transition assist circuit may be coupled to the BL and/or BLB to increase the pull-up and pull-down speed of the BL and/or BLB. For instance, as illustrated in FIG. 6D, a transition assist circuit 586 may be coupled to the BL, or as illustrated in FIG. 6E, a transition assist circuit 587 may be coupled to the BLB. As compared to the BNN periphery circuit 530 of FIG. 6A, one less inverter may be implemented between the inverter 602 and the counter 596, since the transition assist circuit 586 serves as an inverter.

Figure 7A:
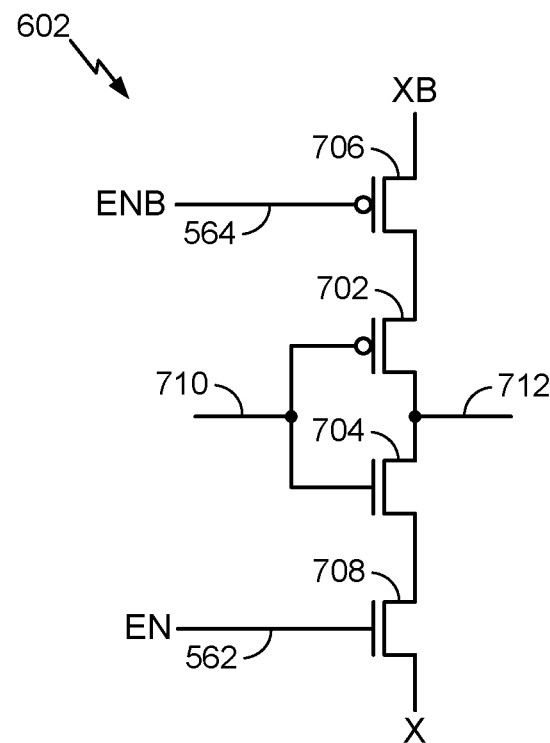
FIGS. 7A and 7B illustrate example implementations of an inverter, in accordance with certain aspects of the present disclosure.
Figure 7B:
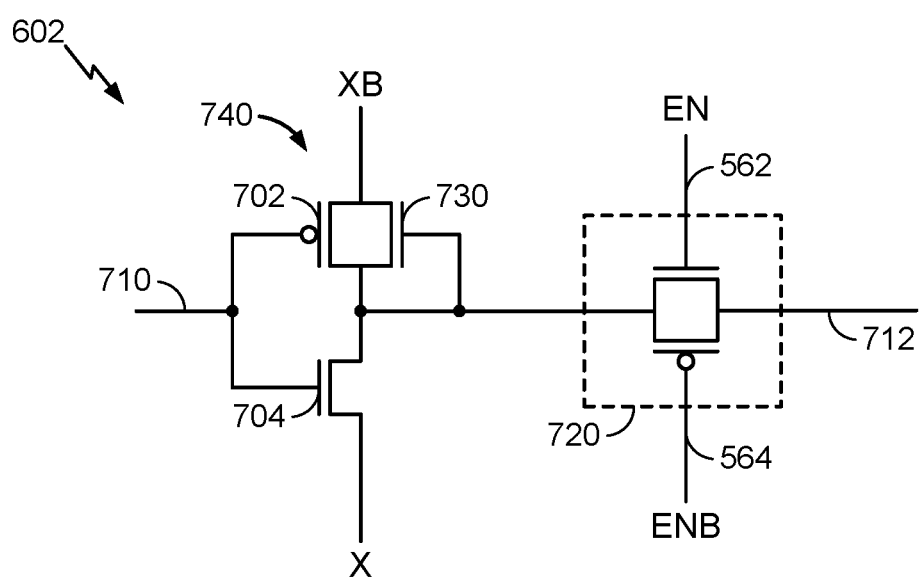

FIGS. 7A and 7B illustrate example implementations of the inverter 602, in accordance with certain aspects of the present disclosure. As illustrated in FIG. 7A, the inverter 602 may include a PMOS transistor 702 having a drain coupled to a drain of an NMOS transistor 704. A source of the PMOS transistor 702 is coupled to a drain of a PMOS transistor 706, and a source of the NMOS transistor 704 is coupled to a drain of an NMOS transistor 708. The source of the PMOS transistor 706 is coupled to the complementary input XB, and the source of the NMOS transistor 708 is coupled to the input X. The PMOS transistor 706 has a gate coupled to the ENB node 564, and the NMOS transistor 708 has a gate coupled to the EN node 562, such that the PMOS transistor 706 and the NMOS transistor 708 are turned on when the signal at the EN node 562 is at a logic high state. The NMOS transistor 704 and the PMOS transistor 702 have gates coupled to an input node 710. Therefore, when the PMOS transistor 706 and the NMOS transistor 708 are turned on and when the logic state at the input node 710 is high, the logic state at the output node 712 is equal to the logic state of the input X. Moreover, when the PMOS transistor 706 and the NMOS transistor 708 are turned on and when the logic state at the input node 710 is low, the logic state at the output node 712 is equal to the logic state of the complementary input XB.

As illustrated in FIG. 7B, the inverter 602 may be implemented with a transmission gate 720 coupled between the output node 712 and the drains of the PMOS transistor 702 and the NMOS transistor 704. The transmission gate 720 is controlled via the signal at the EN node 562 and the signal at the ENB node 564. When the transmission gate 720 is turned on via the signal at the EN node 562 and the signal at the ENB node 564 and when the logic state at the input node 710 is logic high, the logic state at the output node 712 is equal to the logic state of the input X. Moreover, when the transmission gate 720 is turned on and when the logic state at the input node 710 is low, the logic state at the output node 712 is equal to the logic state of the complementary input XB. In certain aspects, an NMOS transistor 730 may be coupled in parallel with the PMOS transistor 702, forming a transmission gate 740 between the complementary input node XB and the drain of the NMOS transistor 704, as illustrated. The gate of the NMOS transistor 730 may be coupled to the drain of the PMOS transistor 702. Implementing a transmission gate 740 reduces the voltage drop between the complementary input signal XB and the output node 712, as compared to only using the PMOS transistor 702.

The in-memory computation process may involve a BL and/or BLB precharge process, followed by a read process. For example, for the configurations described with respect to FIGS. 5A to 5D, both the BL and BLB may be precharged during the precharge process, while the logic state at WL and the EN signal are at logic low. For the configuration described with respect to FIGS. 6A, 6B, and 6D, the BL may be precharged, and for the configuration described with respect to FIGS. 6C and 6E, the BLB may be precharged. During the read process, the logic state of the WL is set to logic high, resulting in the BL and BLB being set to the logic state of respective FF output nodes N1 and N2. The EN signal is then set to logic high while setting the logic state of the input X and/or complementary input XB. The counter 596 then stores the results of the computation, after which the logic state of the WL and input signal X, and the EN signal may be set to logic low. The BL and/or BLB may then be precharged again for another computation for another memory cell associated with the BL and the BLB, as described herein. In other words, computation may be performed for each memory cell associated with the BL and the BLB, which may be accumulated by the counter 596.

Figure 8:
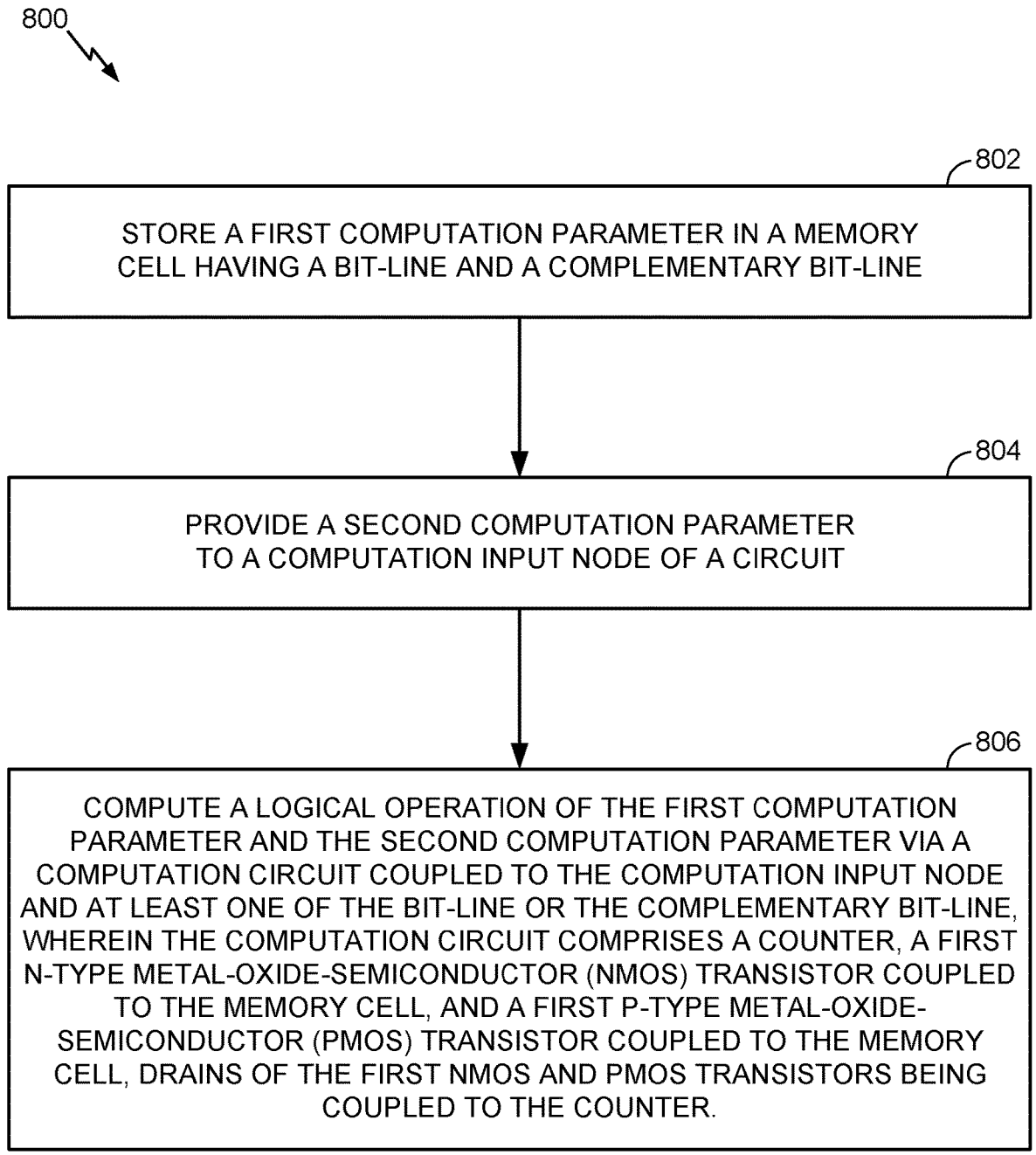
FIG. 8 is a flow diagram illustrating example operations for in-memory computation, in accordance with certain aspects of the present disclosure.

FIG. 8 is a flow diagram illustrating example operations 800 for in-memory computation, in accordance with certain aspects of the present disclosure. The operations 800 may be performed by in-memory computation circuitry, such as the circuitry described with respect to FIGS. 5A, 5B, 5C, 5D, 6A, 6B, 6C, 6D, 6E, 7A, and/or 7B.

The operations 800 begin, at block 802, with the in-memory computation circuitry storing a first computation parameter in a memory cell (e.g., memory cell 500) having a bit-line (e.g., bit-line 510) and a complementary bit-line (e.g., complementary bit-line 512), and at block 804, providing a second computation parameter to a computation input node (e.g., computation input node 540) of a circuit. At block 806, the in-memory computation circuitry may compute a logical operation of the first computation parameter and the second computation parameter via a computation circuit (e.g., BNN periphery circuit 530) coupled to the computation input node and at least one of the bit-line or the complementary bit-line. In certain aspects, the computation circuit may include a counter (e.g., counter 596), a first NMOS transistor (e.g., NMOS transistor 534 or 704) coupled to the memory cell, and a first PMOS transistor (e.g., PMOS transistor 538 or 702) coupled to the memory cell, drains of the first NMOS and PMOS transistors being coupled to the counter. In certain aspects, the logical operation may include an exclusive NOR (XNOR) or exclusive OR (XOR) operation.

In certain aspects, gates of the first NMOS transistor and the first PMOS transistor are coupled to the computation input node. In certain aspects, a source of the first NMOS transistor is coupled to the bit-line, and a source of the first PMOS transistor is coupled to the complementary bit-line. In certain aspects, the computation circuit further may also include a second PMOS transistor (e.g., PMOS transistor 536) having a source coupled to the drain of the first NMOS transistor and having a drain coupled to a source of the first NMOS transistor. In some cases, the computation circuit further may include a second NMOS transistor (e.g., NMOS transistor 541) having a source coupled to the drain of the first PMOS transistor and having a drain coupled to a source of the first PMOS transistor.

In certain aspects, a source of the first PMOS transistor (e.g., PMOS transistor 702) is coupled to a complementary computation input node of the circuit, and wherein a source of the first NMOS transistor (e.g., NMOS transistor 704) is coupled to the computation input node. In some cases, the operations 800 may also include providing an enable signal to an enable input node (e.g., EN node 562) of an enable circuit (e.g., transmission gate 560), the enable circuit having a second NMOS transistor (e.g., NMOS transistor 563) coupled between the counter and the drains of the first NMOS transistor and the first PMOS transistor, a gate of the second NMOS transistor being coupled to the enable input node. In certain aspects, the operations 800 may also include providing a complementary enable input signal to a complementary enable input node (e.g., ENB node 564) of the enable circuit, the enable circuit further including a second PMOS transistor (e.g., PMOS transistor 565) having a source coupled to a drain of the second NMOS transistor and a drain coupled to a source of the second NMOS transistor, a gate of the second PMOS transistor being coupled to the complementary enable input node.

The various illustrative circuits described in connection with aspects described herein may be implemented in or with an integrated circuit (IC), such as a processor, a digital signal processor (DSP), an application-specific integrated circuit (ASIC), a field-programmable gate array (FPGA), or other programmable logic device. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is also noted that the operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A circuit for in-memory computation, comprising:
   a memory cell having a bit-line and a complementary bit-line; and
   a computation circuit coupled to a computation input node of the circuit and at least one of the bit-line or the complementary bit-line, wherein:
   the computation circuit comprises a counter, a first n-type metal-oxide-semiconductor (NMOS) transistor coupled to the memory cell, and a first p-type metal-oxide-semiconductor (PMOS) transistor coupled to the memory cell, drains of the first NMOS and PMOS transistors being coupled to the counter;
   a gate of the first NMOS transistor is connected with the computation input node;
   a gate of the first PMOS transistor is coupled to the computation input node;
   a source of the first NMOS transistor is coupled to the bit-line; and
   a source of the first PMOS transistor is coupled to the complementary bit-line.

2. The circuit of claim 1, wherein the computation circuit is configured to perform an exclusive NOR (XNOR) or exclusive OR (XOR) operation.

3. The circuit of claim 1, wherein the computation circuit further comprises a second PMOS transistor having a source coupled to the drain of the first NMOS transistor and having a drain coupled to the source of the first NMOS transistor.

4. The circuit of claim 3, wherein the computation circuit further comprises a second NMOS transistor having a source coupled to the drain of the first PMOS transistor and having a drain coupled to the source of the first PMOS transistor.

5. A circuit for in-memory computation, comprising:
   a memory cell having a bit-line and a complementary bit-line;
   a computation circuit coupled to a computation input node of the circuit and at least one of the bit-line or the complementary bit-line, wherein the computation circuit comprises a counter, a first n-type metal-oxide-semiconductor (NMOS) transistor coupled to the memory cell, and a first p-type metal-oxide-semiconductor (PMOS) transistor coupled to the memory cell, drains of the first NMOS and PMOS transistors being coupled to the counter; and
   an enable circuit having:
      a second NMOS transistor coupled between the computation input node and the first NMOS transistor, a gate of the second NMOS transistor being coupled to an enable input node; and
      a second PMOS transistor coupled between a complementary computation input node and the first PMOS transistor, a gate of the second PMOS transistor being coupled to a complementary enable input node.

6. A circuit for in-memory computation, comprising:
   a memory cell having a bit-line and a complementary bit-line;
   a computation circuit coupled to a computation input node of the circuit and at least one of the bit-line or the complementary bit-line, wherein the computation circuit comprises a counter, a first n-type metal-oxide-semiconductor (NMOS) transistor coupled to the memory cell, and a first p-type metal-oxide-semiconductor (PMOS) transistor coupled to the memory cell, drains of the first NMOS and PMOS transistors being coupled to the counter, and wherein a gate of the first NMOS transistor is connected with the computation input node; and
   an enable circuit having a second NMOS transistor coupled between the counter and the drains of the first NMOS transistor and the first PMOS transistor, a gate of the second NMOS transistor being coupled to an enable input node.

7. The circuit of claim 6, wherein the enable circuit further comprises a second PMOS transistor having a source coupled to a drain of the second NMOS transistor and a drain coupled to a source of the second NMOS transistor, a gate of the second PMOS transistor being coupled to a complementary enable input node.

8. The circuit of claim 1, wherein the memory cell is one of a plurality of memory cells of a static random-access memory (SRAM).

9. The circuit of claim 1, further comprising a transition assist circuit coupled to at least one of the bit-line or the complementary bit-line, the transition assist circuit comprising:
- a first inverter; and
- a second inverter, an output of the first inverter being coupled to an input of the second inverter and an output of the second inverter being coupled to an input of the first inverter.

10. The circuit of claim 1, further comprising an enable circuit having:
- a second NMOS transistor coupled between the computation input node and the first NMOS transistor, a gate of the second NMOS transistor being coupled to an enable input node; and
- a second PMOS transistor coupled between a complementary computation input node and the first PMOS transistor, a gate of the second PMOS transistor being coupled to a complementary enable input node.

11. The circuit of claim 5, wherein at least one of a gate of the first NMOS transistor or a gate of the first PMOS transistor is coupled to the computation input node.

12. The circuit of claim 11, wherein a source of the first NMOS transistor is coupled to the bit-line, and wherein a source of the first PMOS transistor is coupled to the complementary bit-line.

\* \* \* \* \*